(12) United States Patent
Simpson et al.

(10) Patent No.: US 12,550,782 B2
(45) Date of Patent: Feb. 10, 2026

(54) SEMICONDUCTOR DEVICE

(71) Applicants: DYNEX SEMICONDUCTOR LIMITED, Lincoln (GB); ZHUZHOU CRRC TIMES SEMICONDUCTOR CO. LTD, Zhuzhou (CN)

(72) Inventors: Robin Adam Simpson, Lincoln (GB); Yangang Wang, Lincoln (GB)

(73) Assignees: DYNEX SEMICONDUCTOR LIMITED, Lincoln (GB); ZHUZHOU CRRC TIMES SEMICONDUCTOR CO. LTD, Zhuzhou (CN)

( * ) Notice: Subject to any disclaimer, the term of this patent is extended or adjusted under 35 U.S.C. 154(b) by 491 days.

(21) Appl. No.: 18/010,570

(22) PCT Filed: Jul. 19, 2021

(86) PCT No.: PCT/EP2021/070110
§ 371 (c)(1),
(2) Date: Dec. 15, 2022

(87) PCT Pub. No.: WO2023/001354
PCT Pub. Date: Jan. 26, 2023

(65) Prior Publication Data
US 2024/0105529 A1    Mar. 28, 2024

(51) Int. Cl.
*H01L 23/10* (2006.01)
*H01L 23/00* (2006.01)

(52) U.S. Cl.
CPC ............ *H01L 23/10* (2013.01); *H01L 23/562* (2013.01)

(58) Field of Classification Search
CPC ..... H01L 23/10; H01L 23/562; H01L 23/051; H01L 23/62; H01L 25/072
See application file for complete search history.

(56) References Cited

U.S. PATENT DOCUMENTS

| 4,399,452 A | 8/1983 | Nakashima et al. |
| 4,567,504 A | 1/1986 | Egerbacher et al. |

(Continued)

FOREIGN PATENT DOCUMENTS

| DE | 202015102948 U1 | 7/2015 |
| EP | 3252809 A1 | 12/2017 |

(Continued)

OTHER PUBLICATIONS

Espacenet translation of JP 2004095992 (Year: 2004).*

(Continued)

*Primary Examiner* — Evan G Clinton
*Assistant Examiner* — Corbyn D Mellinger
(74) *Attorney, Agent, or Firm* — Tarolli, Sundheim, Covell & Tummino LLP

(57) ABSTRACT

The present disclosure provides a semiconductor device that includes a housing having an internal space, at least one semiconductor chip arranged inside the housing, and a separator arranged inside the housing and configured to separate the internal space of the housing into a first chamber and a second chamber. The at least one semiconductor chip is arranged within the first chamber. The separator includes a deformable portion that is configured to deform when a pressure difference between the first and second chambers exceeds a threshold differential pressure or when a temperature at the deformable portion exceeds a threshold temperature, so as to transform the first chamber from a hermetically sealed chamber to an open chamber in fluid communication with the second chamber.

18 Claims, 3 Drawing Sheets

(56) References Cited

U.S. PATENT DOCUMENTS

| | | | |
|---|---|---|---|
| 9,559,027 | B2 | 1/2017 | Kuwahara |
| 2015/0069589 | A1* | 3/2015 | Kamata ............. H01L 23/49575 |
| | | | 257/666 |
| 2016/0247736 | A1* | 8/2016 | Kuwahara ............... H01L 23/18 |
| 2016/0329286 | A1 | 11/2016 | Homola |

FOREIGN PATENT DOCUMENTS

| | | | |
|---|---|---|---|
| JP | S54 8975 | A | 1/1979 |
| JP | S5425165 | A | 2/1979 |
| JP | 2004095992 | * | 3/2004 |
| WO | 2015/172956 | A1 | 11/2015 |
| WO | 2016184590 | A1 | 11/2016 |

OTHER PUBLICATIONS

International Search Report and Written Opinion issued in connection with corresponding PCT Patent Application No. PCT/EP2021/070110 dated Apr. 8, 2022.

* cited by examiner

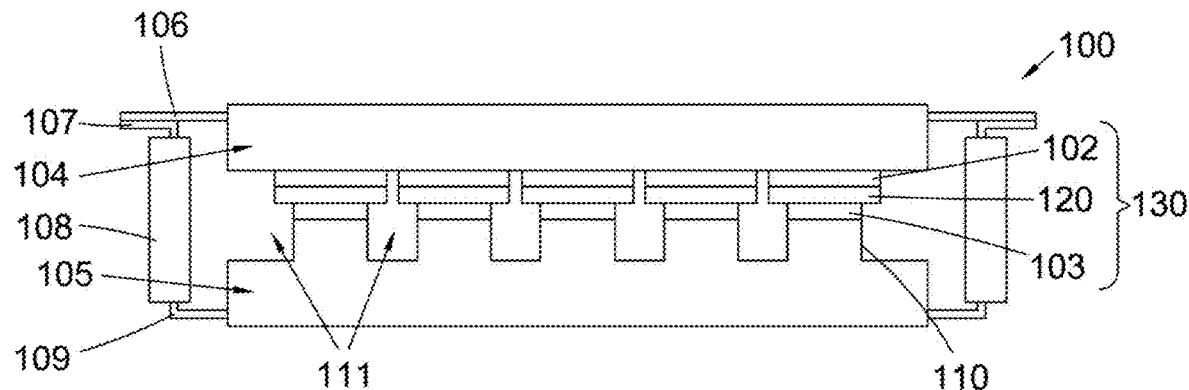
Figure 1 - Prior art
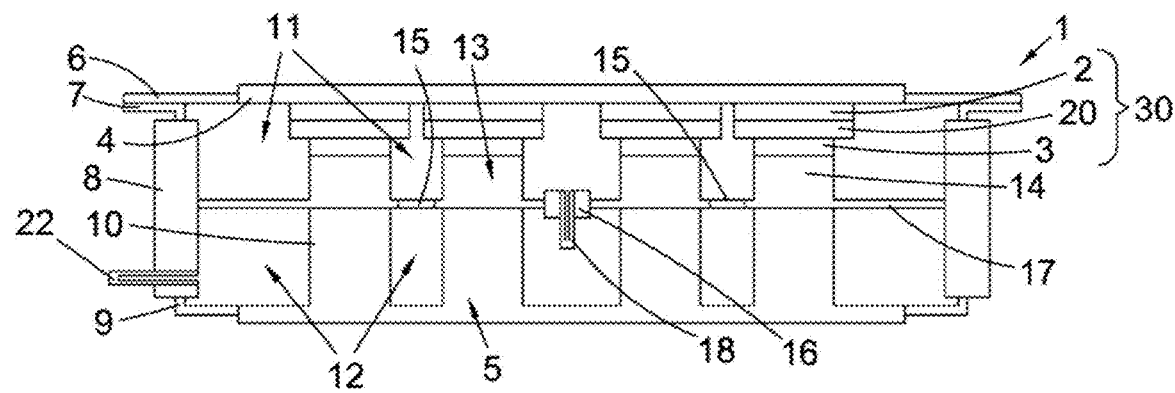
Figure 2
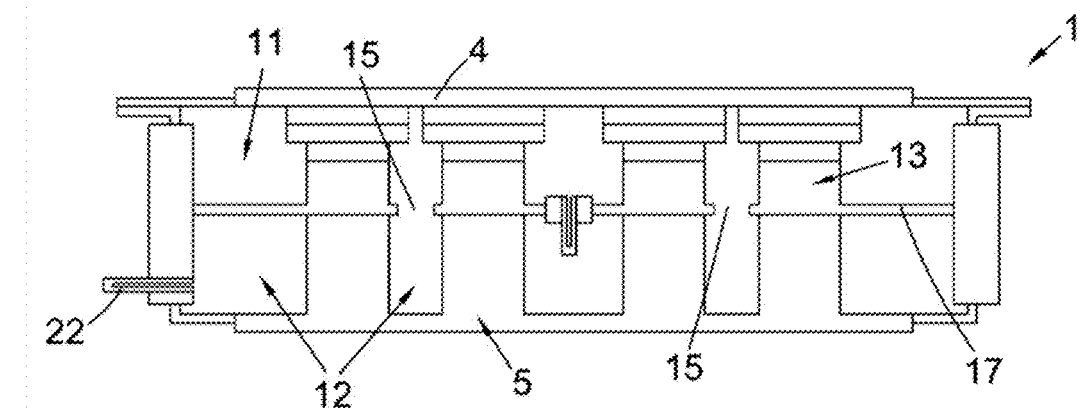
Figure 3

SEMICONDUCTOR DEVICE

RELATED APPLICATIONS

The present invention is a U.S. National Stage under 35 USC 371 patent application, claiming priority to PCT Application No. PCT/EP2021/070110, filed on Jul. 19, 2021; the entirety of which is hereby incorporated herein by reference.

TECHNICAL FIELD

The present disclosure relates to a semiconductor device. More particularly, but not exclusively, the present disclosure relates to a power semiconductor device having an improved failure mode.

BACKGROUND

A power semiconductor device may house one or more power semiconductor chips (or dies). The power semiconductor chips are often used to switch high currents and voltages, and may include one or more of a power transistor, a power diode, and a thyristor, etc. A power transistor includes, but is not limited to, a power metal-oxide-semiconductor field effect transistor (MOSFET), a power bipolar junction transistor (BJT), and an insulated gate bipolar transistor (IGBT), etc. A thyristor includes, but is not limited to, an integrated gate-commutated thyristor (IGCT), and a gate turn-off thyristor (GTO), etc. The power semiconductor device may also be referred to as a power module or a power electronic module.

It is common for a power semiconductor device to have a hermetic package. The hermetic package provides a hermetically sealed housing (or case) which encloses an internal space, and one or more power semiconductor chips are arranged within the internal space of the housing. The hermetic package is often filled with an inert gas (e.g., nitrogen) to prevent moisture, dust particles and/or other foreign particles from entering the package, thereby ensuring normal operation of the chips. The terms "housing" and "case" are used interchangeably below.

FIG. 1 schematically illustrates a sectional view of a known power semiconductor device 100 which has a press-pack package. The press-pack package is typically a hermetic package. Press-pack power semiconductor devices are an alternative to traditional isolated-base power semiconductor devices, in which power semiconductor chips are typically soldered on isolated substrates that carry the chips respectively and are also wire-bonded to the substrates. Instead of the wire bonds and solder joints used in isolated-base devices, press-pack devices typically rely on the application of force by an external clamping system, to make contact to the chips.

As shown in FIG. 1, the press-pack power semiconductor device 100 comprises a plurality of semiconductor chips 120. Individual semiconductor chips 120 are connected in parallel within a single pressure contact housing to produce a single device containing multiple chips with a current handling capability that is ideally the sum of the capability of all the chips contained within the housing. The semiconductor chips 120 are placed between mechanical strain buffers 102, 103 to form semiconductor units 130. These semiconductor units 130 are then positioned between upper and lower electrodes 104, 105 in a hermetically-sealed housing which is formed by the electrodes 104, 105, a ceramic tube 108 and thin flanges 106, 107, 109. The thin flanges include a lid flange 106, a housing upper flange 107, and a housing lower flange 109. The thin flanges 106, 107, 109 make a gas-tight, flexible joint between the electrodes 104, 105 and the ceramic tube 108. The hermetically-sealed housing encloses an internal space 111. The internal space 111 is typically filled with nitrogen.

It is typical that one electrode (e.g., the upper electrode 104) is flat and the other (e.g., the lower electrode 105) has an array of pillars 110 formed on its inner surface. The semiconductor units 130 typically have upper and lower contact regions of differing areas. As shown in FIG. 1, the pillars 110 of the lower electrode 105 permit contact to the smaller area at the bottom surfaces of the chips 120.

Power semiconductor devices with hermetic cases are vulnerable to uncontrolled case ruptures in the event of excessive internal gas pressure. Internal gas pressure may be increased to critical levels by events such as a high energy discharge from local energy storage or continued operation in a state known as short-circuit failure mode.

High energy discharge may occur if a power semiconductor device fails and loses its ability to withstand high voltage. Commonly, power semiconductor devices are connected in circuits containing very large capacitors capable of storing tens of kilojoules of electrical energy to form an electrical system. During operation of the system, the voltage across the capacitors is maintained at a high level. This is enabled by the high voltage blocking capability of the devices. In the event of failure of a device, its high voltage blocking capability is lost and the energy from the capacitor (s) is discharged very rapidly in the form of a high electrical current, typically over the course of a few tens of microseconds. When a device (e.g., the device 100) fails, it does so initially at a single point (e.g., a single one of the chips 120). This point assumes a low impedance state relative to the rest of the device. Electrical current would follow the path of least resistance and therefore tends to flow through the failure point. In the event of a high energy discharge, the high current density at this point leads to rapid and excessive heating causing melting and thermal decomposition of adjacent components and the generation of high pressure within the internal space (e.g., the space 111) of the hermetically-sealed case. If the high pressure exceeds the pressure withstand capabilities of the case, then the case will rupture, often in an unpredictable manner.

In a system with in-built redundancy (i.e., the number of devices used exceeds the minimum required), if a failed device withstands the initial high energy discharge event, it is often required to operate in what is known as the short-circuit failure mode for an extended period of time, typically until the next scheduled maintenance of the system, which may occur at intervals of one year or more. In the short-circuit failure mode, the failed device must achieve and maintain a low impedance state approximating a short circuit to enable continued operation of the system as a whole. In this state, the load current for the system is typically conducted through a small area in the failed device, such as a single failed chip. This leads to the generation of high local temperatures within the case of the device. The high temperatures not only increase the pressure of gas (e.g., nitrogen) within the housing, but may also cause thermal decomposition of polymeric components, generating additional gases and further increasing internal pressure. If the internal gas pressure exceeds the withstand capability of the case, then, as for the high energy discharge event, the case may rupture in an unpredictable manner.

Case rupture of a power semiconductor device is hazardous for both neighbouring equipment and personnel due to emission of high temperature gases and ejection of debris including metals and ceramics, among other materials. In applications where uncontrolled case rupture cannot be tolerated, additional safety measures such as enclosures or shielding are often provided. Those measures incur additional costs which may not be acceptable.

It is preferable that case rupture of a power semiconductor device is controlled in a predictable manner so as to reduce the danger of explosive destructions caused by the failure of the device. Known techniques typically involve the use of a rupture disk (or a fragile portion) in the hermetic case of the power semiconductor device. The rupture disk would remain sealed during normal operation of the device, but would break open in the event of high pressure or high temperature generated during the failure mode described above. In particular, two existing designs are known.

The first design is described in WO 2015/172956 A1 and U.S. Pat. No. 9,559,027 B2. In this design, a rupture disk with a lower resistance to a pressure increase or a temperature increase than the rest of the case is formed in the wall of the ceramic tube 108. Since the rupture disk is more sensitive to pressure increase and/or temperature increase than the rest of the case, rupture would occur preferentially at this location.

The second design is described in WO 2015/172956 A1 and US 2015/0069589 A1. In this design, a rupture disk is formed in the thin flange material (e.g., the lid flange 106) that connects a housing electrode to the ceramic tube 108. As for the first design, overpressure or over-temperature is expected to cause the rupture disk to break open before uncontrolled explosive rupture of the device's case occurs.

In the known designs, once the rupture disk breaks open, the rupture disk establishes a fluid communication path between the internal space 111 of the case and an exterior of the case (e.g., the ambient air). Thus, the case of the device would no longer be hermetically sealed. Gases and explosion debris can leave the case via the rupture disk. In this way, overpressure within the case is relieved and guided to the outside of the case in a controlled manner.

The disadvantages of the known designs described above is that in some applications, the power semiconductor device is immersed in coolant, and it is not preferable that gases and explosion debris are discharged from the case into the coolant.

Another way to mitigate the danger caused by case rupture of a power semiconductor device is to improve the rupture resistance of the case. Known techniques involve the use of protective shield(s) within the case to obstruct the path of hot gases and explosion debris between the failure location and the inside surfaces of the ceramic tube 108 and the thin flanges 106, 107, 109. The protective shields are typically manufactured from insulating materials such as ceramics and polymers or a mixture thereof. DE 202015102948 U1, U.S. Pat. No. 4,399,452 A, JP S54-25165 A and WO 2016/184590 A1 disclose various examples of the protective shields.

The materials of the protective shields are not ideal. In particular, protective shields made of polymers may help to prevent explosive case rupture up to some level of energy, but they may at the same time increase the level of pressure cumulated inside of the case. This is because polymers will undergo thermal decomposition at the high temperatures experienced during the short-circuit failure mode, and the thermal decomposition increases the internal gas pressure inside the sealed case. Therefore, in case the overpressure exceeds a critical value, protective shields made of polymers have only limited effects.

Ceramic materials are typically brittle and are difficult to manufacture to precise dimensions by mass production techniques with acceptable costs. Therefore, protective shields made of ceramics typically require a wide dimensional tolerance. Further, the ceramic shields need to be relatively thick to resist fracture. Therefore, sufficient additional space is required in the housing to accommodate the ceramic shields.

Limited metal shields have also been used, but they are typically employed simply to provide shielding for the flanges (e.g., the flanges 106, 107, 109) of the housing, not the ceramic tube 108. Shielding for the ceramic tube 108 is still provided using polymers.

Another disadvantage of using the protective shields is that the high pressure would stay inside the hermetically sealed case of the failed device, and accordingly there is a danger of a malfunction and an undefined degassing in later manipulation stage with the failed device.

It is an object of the present disclosure, among others, to provide a semiconductor device with an improved failure mode, which solves problems associated with known semiconductor devices, whether identified herein or otherwise.

SUMMARY

According to a first aspect of the present disclosure, there is described a semiconductor device, comprising: a housing enclosing an internal space; at least one semiconductor chip arranged inside the housing; and a separator arranged inside the housing and configured to separate the internal space of the housing into a first chamber and a second chamber, wherein the at least one semiconductor chip is arranged within the first chamber; wherein the separator comprises a deformable portion, and the deformable portion is configured to deform when a pressure difference between the first and second chambers exceeds a threshold differential pressure or a temperature at the deformable portion exceeds a threshold temperature, so as to transform the first chamber from a hermetically sealed chamber to an open chamber in fluid communication with the second chamber.

Advantageously, by having a separator to separates the internal space of the housing into first and second chambers, the first chamber may be filled with a suitable gas at a desired pressure level to create an environment that ensures normal operation of the at least one semiconductor chip, and meanwhile, the gas contained and/or the internal pressure within the second chamber may differ from that of the first chamber without impacting the operation of the at least one semiconductor chip. In the event of failure of the semiconductor device, extreme heating within the first chamber may lead to an increase in the internal gas pressure of the first chamber, and/or an increase in the temperature around the first chamber. The pressure increase or the temperature increase, once exceeding a respective threshold value, would cause the deformable portion to deform. The deformation of the deformable portion allows gas from the first chamber to freely flow into the second chamber, thereby relieving the pressure built-up inside the first chamber and thus reducing the risk of explosive rupturing of the housing. Therefore, with the separator and its deformable portion, the semiconductor device has an improved failure mode and a higher reliability.

In other words, the deformable portion has an original intact condition and a deformed condition. During the intact condition of the deformable portion, the first chamber is hermetically sealed. During the deformed condition of the deformable portion, the deformable portion provides a fluid communication path (e.g., an opening) between the first and second chambers so as to relieve the pressure built-up inside the first chamber.

The term "deform" or "deformable" covers any type of deformation of the deformable portion which allows the first chamber to become an open chamber in fluid communication with the second chamber. For example, it covers at least rupturing, melting, bursting, and/or shattering of the deformable portion.

The deformable portion may have a resistance to at least one of a pressure increase and a temperature increase that is less than other portions of the separator.

In other words, the deformable portion is a fragile portion, and would tend to break open before other portions of the separator due to a pressure/temperature increase. Consequentially the separator may break at the localized deformable portion upon being subjected to an increased pressure/temperature.

The first chamber may be enclosed by a first housing arrangement comprising a first part of the housing and the separator.

The deformable portion may have a resistance to at least one of a pressure increase and a temperature increase that is less than other portions of the first housing arrangement.

The first chamber may comprise an inert gas. The inert gas may comprise nitrogen.

The deformation of the deformable portion may be configured to transform the second chamber from a hermetically sealed chamber to an open chamber in fluid communication with the first chamber.

In other words, the second chamber may be hermetically sealed prior to the deformation of the deformable portion.

The second chamber may have a lower gas pressure than the first chamber prior to the deformation of the deformable portion.

Advantageously, this allows the semiconductor device to have a higher housing-non-rupture capability or, in other words, may sustain higher energy levels during the failure mode without explosive rupturing of the housing.

The housing may be hermetic.

That is, the housing remains hermetically sealed regardless of the deformation of the deformable portion. Advantageously, the deformation of the deformable portion would not discharge gases and explosion debris into an exterior of the semiconductor device. This allows the semiconductor device to be used in power applications which restrict the device from discharging matters into its neighbourhood.

The second chamber may be in fluid communication with an exterior of the housing (e.g., the ambient atmosphere).

The deformable portion may have a circular disk shape.

The deformable portion may have a thickness which is less than other portions of the separator.

The deformable portion may have a thickness of at least about 0.3 mm.

The separator may comprise more than one deformable portion.

The deformable portion may be an integral part of the separator. The deformable portion may be formed by applying a material removal process on the separator.

The deformable portion may be attached to other portions of the separator, by, for example, brazing, soldering or welding. Alternatively, the deformable portion may be attached to other portions of the separator via an additional structure (e.g., a frame).

The housing may comprise a first electrode and a second electrode arranged at opposite sides of the at least one semiconductor chip, and an electrical insulator surrounding the at least one semiconductor chip and arranged between the first and second electrodes.

The at least one semiconductor chip may be electrically coupled to each of the first and second electrodes.

The at least one semiconductor chip may be thermally coupled to each of the first and second electrodes.

The term "electrically coupled" includes that one or more intervening element(s) adapted for electrical conduction may exist between the electrically coupled elements. Similarly, the term "thermally coupled" includes that one or more intervening element(s) adapted for thermal conduction may exist between the thermally coupled elements.

The separator may be arranged between the at least one semiconductor chip and the second electrode.

The electrical insulator may comprise a vent which provides a fluid communication path between the second chamber and the exterior of the housing.

The separator may be bonded to the electrical insulator.

The housing may further comprise a first flange connecting the first electrode with the electrical insulator, and a second flange connecting the second electrode with the electrical insulator.

The separator may be bonded to one of the first flange and the second flange.

The separator may comprise a base layer and a first array of pillars extending from a first surface of the base layer into the first chamber.

The separator may further comprise a second array of pillars extending from a second surface of the base layer into the second chamber, the second surface being opposite to the first surface.

The at least one semiconductor chip and the separator may be clamped between the first and second electrodes.

The semiconductor device may further comprise a first strain buffer arranged between the at least one semiconductor chip and the first electrode.

The semiconductor device may further comprise a second strain buffer arranged between the at least one semiconductor chip and the separator.

The semiconductor device may be a power semiconductor device, and the at least one semiconductor chip may comprise at least one power semiconductor chip.

According to a second aspect of the present disclosure, there is provided a method of manufacturing a semiconductor device, the method comprising: providing a housing which comprises an internal space; arranging at least one semiconductor chip inside the housing; and arranging a separator inside the housing, wherein the separator is configured to separate the internal space of the housing into a first chamber and a second chamber, wherein the at least one semiconductor chip is arranged within the first chamber; wherein the separator comprises a deformable portion, and the deformable portion is configured to deform when a pressure difference between the first and second chambers exceeds a threshold differential pressure or a temperature at the deformable portion exceeds a threshold temperature, so as to transform the first chamber from a hermetically sealed chamber to an open chamber in fluid communication with the second chamber.

Where appropriate any of the optional features described above in relation to one of the aspects of the present disclosure may be applied to another one of the aspects of the disclosure.

The term "about" or "approximately" used in the present disclosure indicate a degree of variability (e.g., 20%) in the stated numerical values.

BRIEF DESCRIPTION OF THE DRAWINGS

In order that the disclosure may be more fully understood, a number of embodiments of the disclosure will now be described, by way of example, with reference to the accompanying drawings, in which:

FIG. 1 is a schematic representation of a known semiconductor device;

FIG. 2 is a schematic representation of a semiconductor device in normal operation according to a first embodiment of the present disclosure;

FIG. 3 is a schematic representation of the semiconductor device of FIG. 2 during a failure mode;

In the figures, like parts are denoted by like reference numerals.

Figure 4:
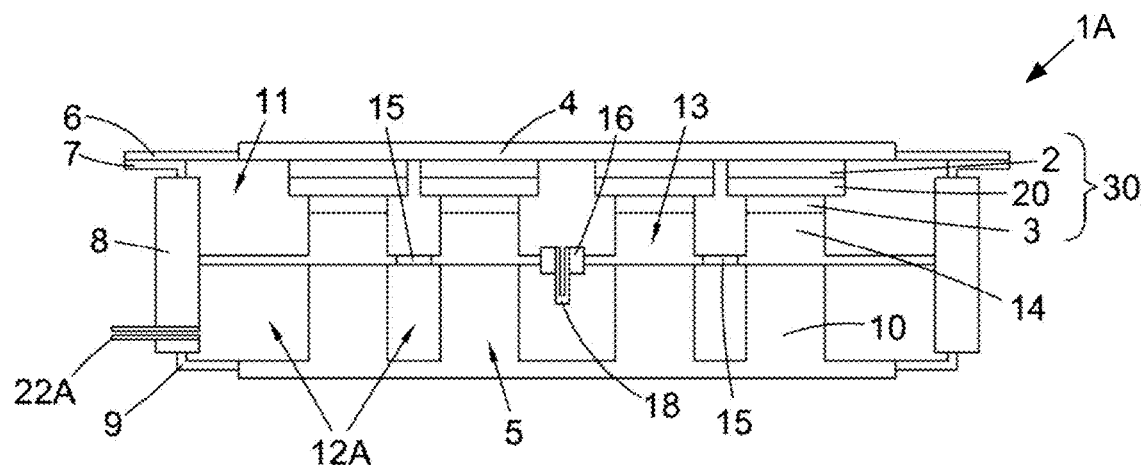
FIG. 4 is a schematic representation of a semiconductor device in normal operation according to a second embodiment of the present disclosure.

It will be appreciated that the drawings are for illustration purposes only and are not drawn to scale.

DETAILED DESCRIPTION OF THE PREFERRED EMBODIMENTS

FIG. 2 schematically illustrates a cross sectional view of a semiconductor device 1 (referred to as the "device" below) according to a first embodiment of the present disclosure. In this example, the semiconductor device 1 is embodied as a multi-chip press-pack power semiconductor device.

As shown in FIG. 2, the device 1 comprises an upper electrode 4, a lower electrode 5, upper strain buffers 2, lower strain buffers 3, and a plurality of power semiconductor chips 20 (referred to as the "chips" below). The upper strain buffers 2 and the lower strain buffers 3 are arranged at opposite surfaces of the chips 20. The upper and lower electrodes 4, 5 are typically made of copper. The upper strain buffers 3 and the lower strain buffers 4 are typically made of molybdenum. The power semiconductor chips 20 may be made in silicon technology, or alternatively may be based upon other types of semiconductors, such as, silicon carbide, gallium nitride, or silicon germanium etc. The chips 20 may comprise one or more of a power transistor (e.g., an IGBT, a power MOSFET, a power BJT), a power diode, and a power thyristor (e.g., an IGCT, a GTO) etc. The upper electrode 4 may be referred to as a "first electrode", and the lower electrode 5 may be referred to as a "second electrode".

During operations of the device 1, the device 1 heats and cools, and consequently each component of the device 1 undergoes thermal expansion and contraction. Difference in the thermal expansion coefficients of adjacent components leads to abrasive wear (also called "fretting") of their contact surfaces. The thermal expansion coefficients of silicon and molybdenum are more closely matched than those of silicon and copper. The strain buffers 2, 3 are useful for reducing the rate of wear on the surfaces of the chips 20. The chips 20 may be silver sintered (or otherwise bonded) to the strain buffers 2, 3 to further reduce the risk of fretting and reduce the thermal resistance of the chips 20. A combination of a single chip 20 with its associated strain buffers 2, 3 may be referred to as a semiconductor unit 30. It would, however, be appreciated that the strain buffers 2, 3 may be wholly or partly omitted from the semiconductor units 30.

The device 1 further includes a lid flange 6, a housing upper flange 7, an electrical insulator 8, and a housing lower flange 9. These components form a gas-tight (or hermetic) connection between the upper electrode 4 and the lower electrode 5. The electrodes 4, 5, the flanges 6, 7, 9 as well as the electrical insulator 8 together form a hermetic housing of the device 1. The upper electrode 4 and the lower electrode 5 may also be referred to as housing electrodes. The lid flange 6 and the housing upper flange 7 connect the upper electrode 4 with the electrical insulator 8. The housing lower flange 9 connects the lower electrode 5 with the electrical insulator 8.

The electrical insulator 8 electrically isolates the upper electrode 4 from the lower electrode 5. The electrical insulator 8 may have a tubular shape and comprises an electrically insulating material (e.g., ceramic). A cross section of the electrical insulator 8 is typically square or circular but may take any suitable shape. It would be appreciated that the electrical insulator 8 may comprise electrically conductive material(s) (e.g., the second gas filing tube 22) as far as the electrically conductive material(s) do not form a conducting path between the electrodes 4, 5. The flanges 6, 7, and 9 may be made of copper or nickel-iron.

The device further comprises a separator 13 arranged between the semiconductor units 30 and the lower electrode 5. The separator 13 is arranged inside the hermetic housing the device 1. In the example of FIG. 2, an outer periphery of the separator 13 is air-tightly bonded to an inner periphery of the electrical insulator 8. In this way, the separator 13 spans the internal diameter of the electrical insulator 8, and separates the internal space enclosed by the hermetic housing the device 1 into two chambers 11, 12. The two chambers 11, 12 include a first chamber 11 and a second chamber 12 arranged at opposite sides of the separator 13. The first chamber 11 (e.g., the upper chamber) is enclosed by the upper electrode 4, the lid flange 6, the housing upper flange 7, a part of the electrical insulator 8 and the separator 13. While FIG. 2 shows that the first chamber 11 includes separate sections located at opposite sides of the semiconductor units 30, it would be understood that the separate sections are in fact interconnected in the third dimension relative to the cross-sectional plane of FIG. 2. The second chamber 12 (e.g., the lower chamber) is enclosed by the lower electrode 5, the housing lower flange 9, the rest of the electrical insulator 8 and the separator 13. Similar to the first chamber 11, the second chamber 12 forms a continuous space. The semiconductor units 30 are located within the first chamber 11.

As shown in FIG. 2, the separator 13 has a base layer 17, and an array of pillars 14 extending from the top surface of the base layer 17 into the first chamber 11. The semiconductor units 30 typically have upper and lower contact regions of differing areas. In the example of FIG. 2, the sizes of the upper contact regions are greater than those of the lower contact regions. The pillars 14 of the separator 13 form contacts with the lower contact regions of the semiconductor units 30. A dry interface may exist between the semiconductor units 30 and the pillars 14. A dry interface means that elements at opposite sides of the interface are coupled by pressure, and there is no bonding material between the elements. Alternatively, a bonding material may be used to create a wet interface between the semiconductor units 30 and the pillars 14. It would be appreciated that the height of the pillars 14 is determined by the required dimension of the first chamber 11, the height of the chips 20 and the heights of the strain buffers 2, 3. The base layer 17 and the pillars 14 of the separator 13 may be made from metal, such as, copper or nickel-iron, or a combination of copper and nickel-iron. The base layer 17 may be bonded to the inner periphery of the electrical insulator 8 using a brazing process.

The lower electrode 5 further comprises an array of pillars 10 extending from its inner surface into the second chamber 12. The pillars 10 form contacts with the bottom surface of the base layer 17. Dry interfaces may exist between the semiconductor units and the upper electrode 4, and/or between the separator 13 and the pillars 10. By clamping the semiconductor units 30 and the separator 13 between the electrodes 4, 5, the chips 20 are electrically and thermally coupled to the electrodes 4, 5. In particular, upper sides of the chips 20 are electrically and thermally coupled to the upper electrode 4. Lower sides of the chips 20 are electrically and thermally coupled to the lower electrode 5. In FIG. 2, the pillars 14 and 10 are shown to have identical widths. It would however be appreciated that this is not necessary and the widths of the pillars 10, 14 may be different.

The separator 13 further includes a feed-through connector 16 which is air-tightly bonded to the base layer 17. The feed-through connector 16 incorporates a first gas filling tube 18. The first gas filling tube 18 allows the gas pressure in the first chamber 11 to be set as desired during the manufacture of the device 1. The electrical insulator 8 has a second gas filing tube 22 for setting the gas pressure in the second chamber 12 during the manufacture of the device 1. Further, a signal wire (not shown in the figures) having one end electrically connected to a control terminal of any chip 20 (e.g., the gate terminal of an IGBT chip) may pass through the feed-through connector 16 and the second gas filling tube 22 and connect to a control terminal external to the device 1. The feed-through connector 16, and the gas filling tubes 18, 22 would be sealed (e.g., by welding) before the completion of the manufacture of the device 1. In an example, the feed-through connector 16 is made of a ceramic material, and the gas filling tubes 18, 22 are made of metal (such as, copper or nickel-iron, or a combination of copper and nickel-iron).

With further reference to FIGS. 2 and 3, the separator 13 has a deformable portion 15 formed therein. While FIGS. 2 and 3 show two deformable portions, it would be understood that this is merely for conceptual clarity and the separator 13 may contain any number of deformable portion(s). The deformable portion 15 is designed to deform (e.g., rupture or melt) when a pressure difference between the first and second chambers 11, 12 exceeds a threshold differential pressure or a temperature at the deformable portion 15 exceeds a threshold temperature. Further, the deformable portion 15 is designed to have a locally low resistance to at least one of a pressure increase and a temperature increase that is lower than other portions of the separator 13. In other words, the deformable portion 15 is a fragile portion. A pressure increase or a temperature increase causes the deformable portion 15 to transition from an original intact condition to a deformed condition.

During the original intact condition of the deformable portion 15 as shown in FIG. 2, the first chamber 11 is a hermetically sealed chamber. Further, with the second gas filling tube 22 sealed, the second chamber 12 is also a hermetically sealed chamber.

During the deformed condition of the deformable portion 15 as show in FIG. 3, the deformable portion 15 provides an opening which serves as a fluid communication path between the chambers 11, 12. Therefore, the first chamber 11 is no longer a hermetically sealed chamber, and becomes an open chamber in fluid communication with the second chamber 12.

As described above, in the event of failure of a power semiconductor device, extreme heating within the hermetic housing of the device will lead to an increase in the internal gas pressure through heating of the existing gas and phase change of polymeric components from solid to gas. However, for known semiconductor devices (e.g., the device 100 of FIG. 1), it is not viable to reduce the resultant gas pressure level in the housing in the event of failure, by manufacturing the device with a lower internal gas pressure to begin with. This is because reducing the internal gas pressure in the hermetic housing will lead to reduction in the dielectric strength of the gas, as described by Paschen's law, thereby damaging the high voltage blocking capability of the device.

By having the separator 13 and the deformable portion 15 incorporated therein, the device 1 of the present disclosure overcomes the limitation encountered by known devices.

More specifically, the separator 13 separates the total internal volume of the hermetic housing of the device 1 into two separate chambers 11, 12 with a gas-tight seal therebetween. This aspect allows the two chambers 11, 12 to contain different gases and/or have different pressures. Since the semiconductor units 30 are located within the first chamber 11 only, the first chamber 11 may be filled with a suitable gas at a desired pressure level to create an environment that is ideal for the long term operation of the chips 20. Meanwhile, there are almost no restrictions to the gas contained in and/or the pressure level of the second chamber 12, because the gas conditions within the second chamber 12 would not significantly impact the normal operation of the chips 20. Therefore, the second chamber 12 may be configured to have a lower gas pressure than the first chamber 11. In an example, the second chamber 12 may be evacuated to vacuum-like conditions.

In the event of failure of the device 1, extreme heating within the hermetically sealed first chamber 11 will lead to an increase in the internal gas pressure of the first chamber 11, and an increase in the temperature around the first chamber 11. The pressure increase or the temperature increase during the failure mode would cause the deformable portion 15 to deform, before the internal pressure of the first chamber 11 increase to the critical point of causing an explosion. Once the deformable portion 15 deforms, gas from the first chamber 11 would be free to flow into the second chamber 12, and the gas pressures within the chambers 11, 12 would be equalised. If the second chamber 12 had a lower pressure than the first chamber 11, this means that the pressure built-up inside the first chamber 11 would be relieved, thus reducing the risk of explosive rupturing of the housing.

Therefore, with the separator 13 and its deformable portion 15, the device 1 allows for a lower resultant gas pressure level in the housing of the device 1 in the event of failure, thereby reducing the risk of housing rupture, while ensuring the high voltage blocking capability of the chips 20 during normal operation of the device 1.

A lower resultant gas pressure level in the housing of the device 1 means that the device 1 has a higher housing-non-rupture capability or, in other words, may sustain higher energy levels during the failure mode without explosive rupturing of the hermetic housing. In some power electronics system which use the device 1, the systems may have a control circuit which would detect the failure mode of the device 1 and turn off the power supplied to the device 1. In such a system, the pressure relief of the first chamber 11 into the second chamber 12 may be sufficient to prevent the housing of the device 1 from rupturing.

Further, the housing of the device 1 remains hermetically sealed regardless of the condition of the deformable portion 15. Therefore, the rupture of the deformable portion 15 would not discharge gases and explosion debris into an exterior of the device 1. Therefore, the device 1 is suitable for use in power applications which restrict the device 1 from discharging matters into its neighbourhood.

In an example, the deformable portion 15 may have a low resistance against pressure. That is, the deformable portion 15 tends to rupture before other portions of the separator 13 due to pressure increases. For instance, the deformable portion 15 may have a circular disc shape, and the thickness of the deformable portion 15 may be less than other portions of the separator 13. The dimension of the deformable portion 15 may depend upon the required threshold differential pressure. By increasing the diameter of the deformable portion 15 and/or reducing the thickness of the deformable portion 15, the deformable portion 15 would rupture at a lower threshold differential pressure. It is desirable for the deformable portion 15 to have a sufficient thickness (typically at least 0.3 mm) which allows the deformable portion 15 to be handled during the manufacture with a reduced risk of premature damage.

It would be appreciated that the resistance of the deformable portion 15 against pressure would allow the deformable portion 15 to remain intact during the manufacturing process of the device 1 and during the normal operation of the device 1, by considering typical differential pressures between the first and second chambers 11, 12 that may exist in service. For example, during the manufacture of the device 1, the first chamber 11 may be filled with nitrogen to achieve an internal pressure of approximately one standard atmospheric pressure at an ambient temperature of 25° C., and the second chamber 11 may be evacuated to vacuum-like condition. Then the differential pressure between the first and second chambers 11, 12 is approximately one standard atmospheric pressure at 25° C. During the normal operation of the device 1, the device 1 may have a typical operating temperature of 125° C., and due to the temperature rise, the differential pressure between the first and second chambers 11, 12 may rise to approximately 1.35 times the standard atmospheric pressure. Therefore, the threshold differential pressure at which the deformable portion 15 deforms must be higher than 1.35 times the standard atmospheric pressure. Further, during the manufacturing process, the hermetic seal of the first chamber 11 may be checked by placing the chamber 11 in a high pressure vessel comprising Helium, followed by detecting the existence of Helium within the first chamber 11. Accordingly, the threshold differential pressure at which the deformable portion 15 deforms must be higher than the pressure difference across the separator 13 when the first chamber 11 is placed within the high pressure vessel.

Therefore, the manufacturing process and the normal operation of the device 1 define the lower limit of the threshold differential pressure of the deformable portion 15.

On the other hand, the resistance of the deformable portion 15 against pressure would not exceed the pressure withstand capability of the housing of the device 1. This allows the deformable portion 15 to break open so as to relieve the pressure of the first chamber 11, before the housing of the device 1 explosively rupture, The pressure withstand capability of the hermetic housing may be established by testing and/or finite element simulation techniques. For example, if the pressure withstand capability of the housing of the device 1 is a critical differential pressure of 10 times the standard atmospheric pressure, then the threshold differential pressure at which the deformable portion 15 deforms must be lower than 10 times the standard atmospheric pressure.

Therefore, the pressure withstand capability of the housing of the device 1 defines the upper limit of the threshold differential pressure of the deformable portion 15.

Generally speaking, the threshold differential pressure of the deformable portion 15 may be any value within a range between the lower limit and the upper limit described above. It is however preferable that the threshold differential pressure of the deformable portion 15 is close to the lower limit of the range, so as to allow the deformable portion to quickly respond in the event of a fault.

Alternatively, the deformable portion 15 may be relatively more susceptible to temperature increases than the other portions of the separator 13. That is, the deformable portion may melt at a lower temperature than the other portions of the separator 13. The threshold temperature which causes the deformable portion 15 to melt may be determined by the material of the deformable portion 15 as well as the thickness of the deformable portion 15. For instance, the deformable portion 15 may be made of a material which has a lower melting point than the material of other portions of the separator 13, and/or the deformable portion 15 may have a thickness which is less than other portions of the separator 13. It would be understood that the threshold temperature would be higher than the maximal temperature occurring at the deformable portion 15 during the manufacture and normal operation of the device 1 (i.e., the lower limit), and lower than the critical temperature at the deformable portion immediately before the explosive rupturing of the housing of the device 1 (i.e., the upper limit). Similarly, it is preferable that the threshold temperature is close to the lower limit so as to allow the deformable portion to quickly respond in the event of a fault.

The deformable portion 15 may be made in a variety of materials, such as metals, graphite, plastics, and may take any suitable form. The material(s) of the deformable portion 15 may be the same as or different from the material(s) of other portions of the separator 13.

In an example, the deformable portion 15 may be formed as an integral part of the separator 13. Specifically, the deformable portion 15 may be made of the same material (e.g., metal, in particular, copper, nickel-iron or a combination of the two materials) as the base layer 17, and a material removal process (e.g., drilling, milling or turning) may be employed to achieve a reduced thickness at the deformable portion 15.

Alternatively, the deformable portion 15 may be separately supplied and attached to the base layer 17 by, for example, brazing, soldering or welding. In this example, the deformable portion 15 may be made of different material(s) than other portions of the separator 13. Further, the deformable portion 15 may be attached to an additional structure (e.g., a frame), which in turn is attached to other portions of the separator 13. It would be appreciated that the thickness of the deformable portion 15 may not necessarily be less than the thickness of other portions of the separator 13.

To assemble the device 1, the semiconductor units 30 and signal circuitry (not shown in FIGS. 2 and 3) are inserted into the first chamber 11. The lid flange 6 is then welded to the housing upper flange 7, and the base layer 17 of the separator 13 is welded to the electrical insulator 8. The first gas filling tube 18 is used to evacuate the first chamber 11, then refill it with a suitable inert gas (e.g., nitrogen) at a suitable pressure (e.g., approximately one standard atmospheric pressure) for reliable operation of the chips 20. The first gas filling tube 18 is then sealed by welding.

The second chamber 12 is then sealed by welding the lower electrode 5 to the housing lower flange 9. The second gas filling tube 22 is used to evacuate the second chamber 12 to create, for example, a vacuum like conditions. The second gas filling tube 22 is then sealed by welding.

As a result, because the second chamber 12 has a lower pressure than the first chamber 11, the total amount of gas in the hermetic housing of the device 1 would be lower than that which would be necessary for the device 100 (provided that the devices 1 and 100 have the same outlined dimensions). In the event of a fault, the deformable portion 15 deforms, and the pressure within the first chamber 11 would be reduced to an average of the pressures within the two chambers 11, 12, thereby reducing the risk of rupture of the housing of the device 1.

FIG. 4 schematically illustrates a cross-sectional view of a semiconductor device 1A according to a second embodiment of the present disclosure. Elements of the device 1A that are identical to those of the device 1 are identified using the same labels. Elements of the device 1A that correspond to, but are different from those of the device 1 are labelled using the same numerals but with a letter 'A' for differentiation. The features and advantages described above with reference to the first embodiment are generally applicable to the second embodiment.

The device 1A differs from the device 1 in that its second gas filling tube 22A is left open to the ambient atmosphere. Therefore, the second chamber 12A of the device 1A is always an open chamber and has an internal pressure equal to the atmospheric pressure. However, the first chamber 11 of the device 1A remains as a hermetically sealed chamber during the intact condition of the deformable portion 15.

In this configuration, once the deformable portion 15 deforms, the internal gases of the first chamber 11 vent to the ambient atmosphere through the second chamber 12A and the second gas filling tube 22A, and the pressure within the first chamber 11 becomes equalized with the atmospheric pressure. Therefore, explosive rupturing of the housing of the device 1A may be prevented.

The device 1A is more advantageous than known designs in which the deformable portion is formed in the electrical insulator 8 or the lid flange 6. Firstly, the separator 13 is arranged within the housing of the device 1A, and the first chamber 11 (where the chips 20 are located) is sealed with the separator 13. By forming the deformable portion 15 in the separator 13, the deformable portion 15 is closer to the chips than the known designs. This allows the deformable portion 15 to react faster to a fault of the device 1A, which typically causes a temperature increase and/or a pressure increase at/around a faulty chip 20. Secondly, the surfaces of the pillars 10 and other internal surfaces of the lower electrode 5 in the second chamber 12A would effectively cool the hot gas exiting the first chamber 11, thereby reducing the risk of harm to personnel and equipment in the vicinity.

The second gas filling tube 22A may have a simple tubular structure. A gas guiding device may be coupled to the external opening of the second gas filling tube 22A. The gas guiding device can be used to guide the gas stream emitted from the housing of the device 1A to a location where danger of harming personnel and equipment is significantly reduced.

Figure 5:
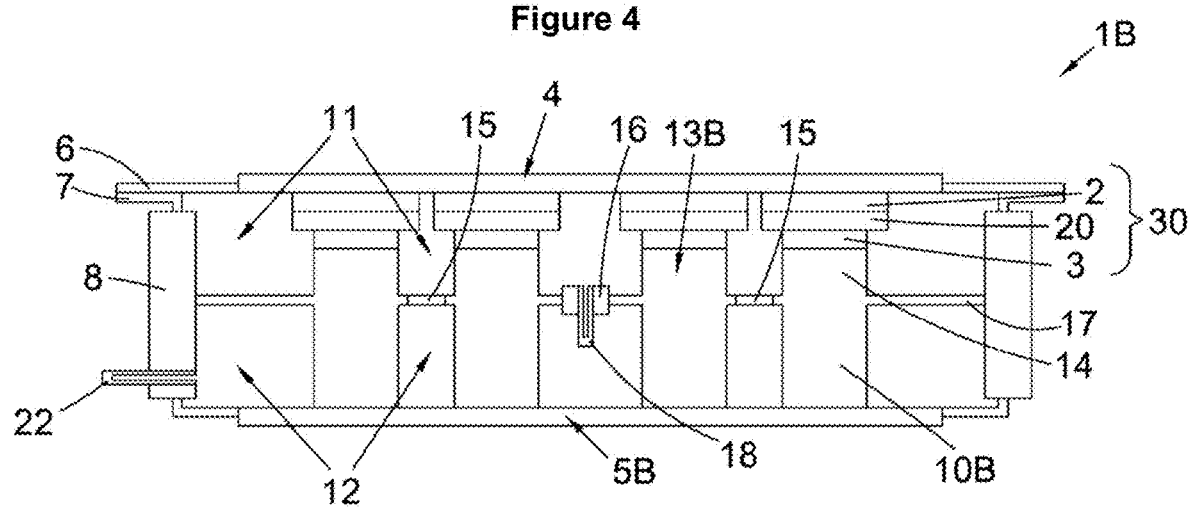
FIG. 5 is a schematic representation of a semiconductor device in normal operation according to a third embodiment of the present disclosure.

FIG. 5 schematically illustrates a cross-sectional view of a semiconductor device 1B according to a third embodiment of the present disclosure. Elements of the device 1B that are identical to those of the device 1 or 1A are identified using the same labels. Elements of the device 1B that correspond to, but are different from those of the device 1 or 1A are labelled using the same numerals but with a letter 'B' for differentiation. The features and advantages described above with reference to the first embodiment are generally applicable to the third embodiment.

The device 1B differs from the device 1 in the configuration of the separator 13B and the lower electrode 5B. In the device 1B, the separator 13B comprises a base layer 17, an array of upper pillars 14 extending from a first surface (e.g., the top surface) of the base layer 17 into the first chamber 11, and an array of lower pillars 10B extending from a second opposite surface (e.g., the bottom surface) of the base layer 17 into the second chamber 12. The lower electrode 5B is a flat electrode, similar to the upper electrode 4. A dry interface may exist between the lower pillars 10B and the lower electrode 5B. By clamping the semiconductor units 30 and the separator 13B between the electrodes 4, 5B, the chips 20 are electrically and thermally coupled to the electrodes 4, 5B.

In the embodiments described above, the separator 13 or 13B is bonded to the electrical insulator 8 in order to separate the internal space of the device's housing into two chambers. However, it would be appreciated that the separator may be bonded to other suitable components of the device's housing. Two examples are described below with reference to FIGS. 6 and 7.

Figure 6:
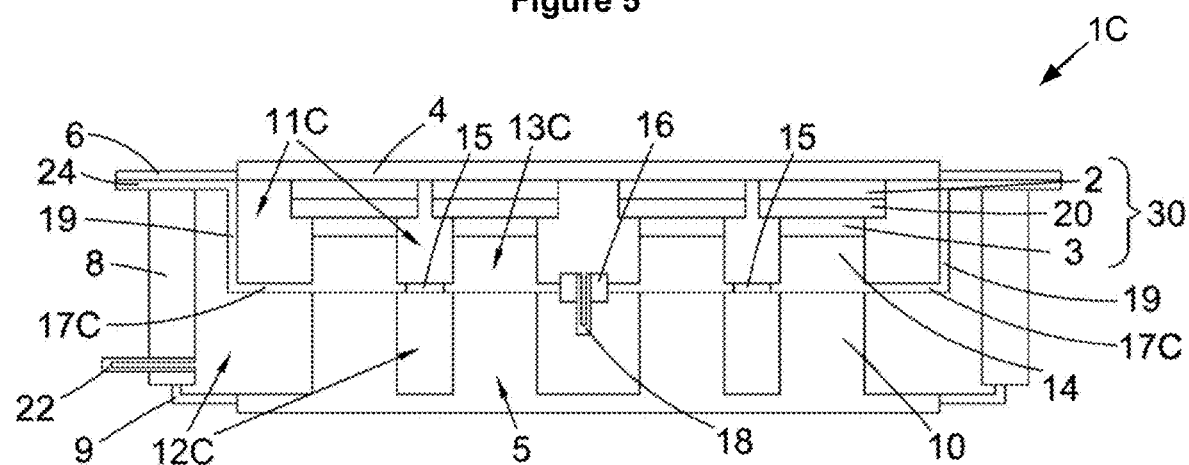
FIG. 6 is a schematic representation of a semiconductor device in normal operation according to a fourth embodiment of the present disclosure.

FIG. 6 schematically illustrates a cross-sectional view of a semiconductor device 1C according to a fourth embodiment of the present disclosure. Elements of the device 1C that are identical to those of the device described above are identified using the same labels. Elements of the device 1C that correspond to, but are different from those of the device described above are labelled using the same numerals but with a letter 'C' for differentiation. The features and advantages described above with reference to the first embodiment are generally applicable to the fourth embodiment.

The device 1C has a separator 13C which is air-tightly bonded to the lid flange 6. In particular, as shown in FIG. 6, the separator 13C comprises a base layer 17C that is generally parallel to the housing electrode 4, 5. The base layer 17C supports the deformable portion 15, the feed-through connector 16 and the pillars 14. The base layer 17C has a diameter which is smaller than an inner diameter of the electrical insulator 8. The separator 13C further comprises a side wall 19 that is generally perpendicular to the base layer 17C, and a flange 24 that is generally parallel to the base layer 17C. The side wall 19 extends between the base layer 17C and the flange 24. The flange 24 of the separator 13C is air-tightly bonded to the lid flange 6, by means of sintering or soldering as an example. The electrical insulator 8 is air-tightly bonded to the flange 24 of the separator 13C, using for example a blazing process. It would be understood that the side wall 19 of the separator 13C is made of an electrically insulating material, so as to avoid creating a short circuit across the chips 20.

In the device 1C, the separator 13C separates the internal space of the housing into a first chamber 11C and a second chamber 12C. The first chamber 11C is enclosed by the upper electrode 4 and the separator 13C. The second chamber 12C is enclosed by the lower electrode 5, the separator 13C, the electrical insulator 8 and the housing lower flange 9.

Figure 7:
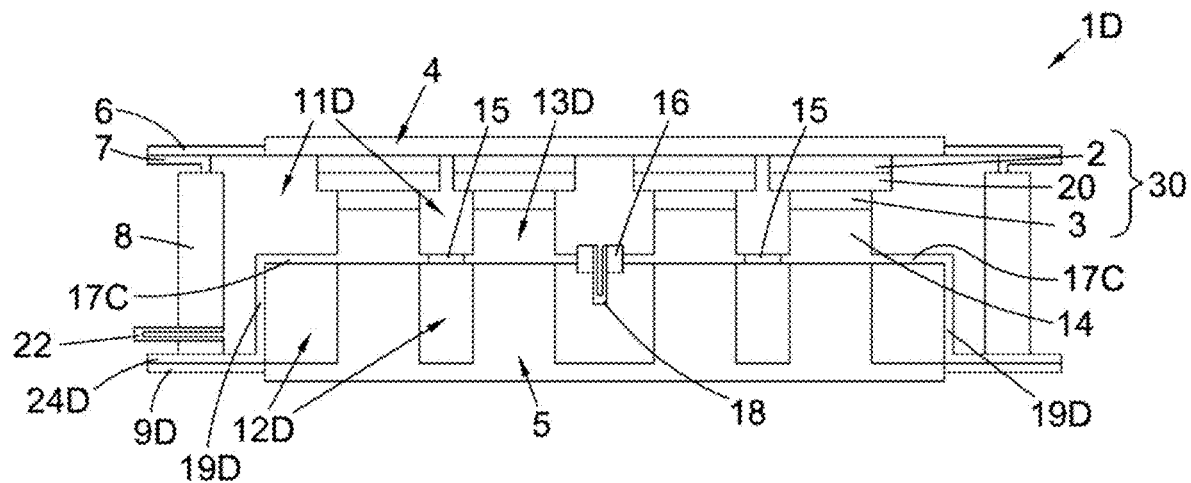
FIG. 7 is a schematic representation of a semiconductor device in normal operation according to a fifth embodiment of the present disclosure.

FIG. 7 schematically illustrates a cross-sectional view of a semiconductor device 1D according to a fifth embodiment of the present disclosure. Elements of the device 1D that are identical to those of the device described above are identified using the same labels. Elements of the device 1D that correspond to, but are different from those of the device described above are labelled using the same numerals but with a letter 'D' for differentiation. The features and advantages described above with reference to the first embodiment are generally applicable to the fifth embodiment.

The device 1D has a separator 13D which is air-tightly bonded to the housing lower flange 9D. The base layer of the separator 13D is identical to the base layer 17C. The separator 13D further comprises a side wall 19 that is generally perpendicular to the base layer 17C, and a flange 24D that is generally parallel to the base layer 17C. The side wall 19 extends between the base layer 17C and the flange 24D. The flange 24D of the separator 13C is air-tightly bonded to the housing lower flange 9D, by means of sintering or soldering as an example. The electrical insulator 8 is air-tightly bonded to the flange 24D of the separator 13D, using for example a blazing process.

As a result, the separator 13D separates the internal space of the housing into a first chamber 11D and a second chamber 12D. The first chamber 11D is enclosed by the upper electrode 4, the lid flange 7, the housing upper flange 7, the electrical insulator 8 and the separator 13D. The second chamber 12D is enclosed by the lower electrode 5 and the separator 13D.

In the devices 1 to 1D as shown in FIGS. 2 to 7, housing electrodes 4, 5 (or 5B) are used as a means of applying pressure. Alternatively, a different means of applying pressure, such as a spring mechanism, may be used.

While FIGS. 2 to 7 relate to multi-chip press-pack power semiconductor devices, it would be appreciated that the separator and its deformable portion may equally be used in the design of any semiconductor device for which explosive rupturing of its hermetic housing is of concern.

Figure 8:
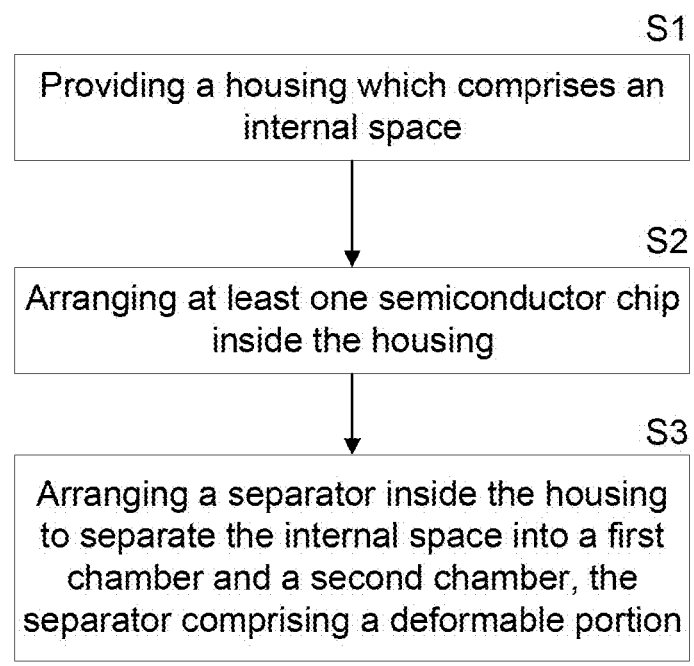
FIG. 8 schematically illustrates processing steps of a method for manufacturing a semiconductor device.

FIG. 8 schematically illustrates processing steps of a method for manufacturing a semiconductor device (e.g., any of the devices 1, 1A-1D).

At step S1, a housing is provided. The housing comprises an internal space.

At step S2, at least one semiconductor chip (e.g., the chips 20) are arranged inside the housing.

At step S3, a separator (e.g., the separator 13, 13B-13D) is arranged inside the housing to separate the internal space of the housing into a first chamber (e.g., the first chamber 11, 11C or 11D) and a second chamber (12, 12A or 12D), with the at least one semiconductor chip being arranged within the first chamber. The separator comprises a deformable portion (e.g., the deformation portion 15). The deformable portion is designed to deform when a pressure difference between the first and second chambers exceeds a threshold differential pressure or a temperature at the deformable portion exceeds a threshold temperature, so as to transform the first chamber from a hermetically sealed chamber to an open chamber in fluid communication with the second chamber.

It would be appreciated that the steps may be performed in a temporal order that is different from the order of description. For example, step S1 may comprise two sub-steps, which provide a first part and a second part of the housing, respectively, and steps S2 and S3 may be performed between the two sub-steps such that the at least one semiconductor chip and the separator are arranged within the housing.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The skilled person will understand that in the preceding description and appended claims, positional terms such as 'upper', 'lower', 'top', 'bottom', etc. are made with reference to conceptual illustrations of a semiconductor device, such as those showing standard sectional views and those shown in the appended drawings. These terms are used for ease of reference but are not intended to be of limiting nature. These terms are therefore to be understood as referring to a semiconductor device when in an orientation as shown in the accompanying drawings.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the disclosure, whether alone or in any appropriate combination with any other feature disclosed or illustrated herein.

The invention claimed is:

1. A semiconductor device, comprising:
a housing comprising an internal space;
at least one semiconductor chip arranged inside the housing, wherein the housing comprises a first housing electrode and a second housing electrode arranged at opposite sides of the at least one semiconductor chip, and an electrical insulator surrounding the at least one semiconductor chip and arranged between the first and second housing electrodes; and
a separator arranged inside the housing and configured to separate the internal space of the housing into a first chamber and a second chamber, wherein the at least one semiconductor chip is arranged within the first chamber;
wherein the separator comprises a deformable portion, and the deformable portion is configured to deform when a pressure difference between the first and second chambers exceeds a threshold differential pressure or a temperature at the deformable portion exceeds a threshold temperature, so as to transform the first chamber from a hermetically sealed chamber to an open chamber in fluid communication with the second chamber, and
wherein a first electrode of the at least one semiconductor chip is electrically and thermally coupled to the first housing electrode, and a second electrode of the at least one semiconductor chip is electrically and thermally coupled to the second housing electrode through the separator.

2. A semiconductor device according to claim 1, wherein the deformable portion has a resistance to at least one of a pressure increase and a temperature increase that is less than other portions of the separator.

3. A semiconductor device according to claim 1, wherein the first chamber comprises an inert gas.

4. A semiconductor device according to claim 1, wherein the deformation of the deformable portion is configured to transform the second chamber from a hermetically sealed chamber to an open chamber in fluid communication with the first chamber.

5. A semiconductor device according to claim 4, wherein the second chamber has a lower gas pressure than the first chamber prior to the deformation of the deformable portion.

6. A semiconductor device according to claim 1, wherein the housing is hermetic.

7. A semiconductor device according to claim 1, wherein the second chamber is in fluid communication with an exterior of the housing.

8. A semiconductor device according to claim 1, wherein the deformable portion has a circular disk shape.

9. A semiconductor device according to claim 1, wherein the deformable portion has a thickness which is less than other portions of the separator.

10. A semiconductor device according to claim 1, wherein the second chamber is in fluid communication with an exterior of the housing, and wherein the electrical insulator comprises a vent which provides a fluid communication path between the second chamber and the exterior of the housing.

11. A semiconductor device according to claim 1, wherein the separator is bonded to the electrical insulator.

12. A semiconductor device according to claim 1, wherein the housing further comprises a first flange connecting the first electrode with the electrical insulator, and a second flange connecting the second electrode with the electrical insulator.

13. A semiconductor device according to claim 12, wherein the separator is bonded to one of the first flange and the second flange.

14. A semiconductor device according to claim 1, wherein the separator comprises a base layer and a first array of pillars extending from a first surface of the base layer into the first chamber.

15. A semiconductor device according to claim 14, wherein the separator further comprises a second array of pillars extending from a second surface of the base layer into the second chamber, the second surface being opposite to the first surface.

16. A semiconductor device according to claim 1, wherein the at least one semiconductor chip and the separator are clamped between the first and second housing electrodes.

17. A semiconductor device according to claim 1, wherein the semiconductor device is a power semiconductor device, and the at least one semiconductor chip comprises at least one power semiconductor chip.

18. A method of manufacturing a semiconductor device, comprising:
 providing a housing which comprises an internal space;
 arranging at least one semiconductor chip inside the housing, wherein the housing comprises a first housing electrode and a second housing electrode arranged at opposite sides of the at least one semiconductor chip, and an electrical insulator surrounding the at least one semiconductor chip and arranged between the first and second housing electrodes;
 arranging a separator inside the housing, wherein the separator is configured to separate the internal space of the housing into a first chamber and a second chamber, wherein the at least one semiconductor chip is arranged within the first chamber;
 electrically and thermally coupling a first electrode of the at least one semiconductor chip to the first housing electrode; and
 electrically and thermally coupling a second electrode of the at least one semiconductor chip to the second housing electrode through the separator,
 wherein the separator comprises a deformable portion, and the deformable portion is configured to deform when a pressure difference between the first and second chambers exceeds a threshold differential pressure or a temperature at the deformable portion exceeds a threshold temperature, so as to transform the first chamber from a hermetically sealed chamber to an open chamber in fluid communication with the second chamber.

* * * * *